(12) United States Patent
Nishida (10) Patent No.: US 10,763,410 B2
(45) Date of Patent: Sep. 1, 2020

(54) LIGHT EMITTING DEVICE

(71) Applicant: NICHIA CORPORATION, Anan-shi, Tokushima (JP)

(72) Inventor: Keigo Nishida, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 274 days.

(21) Appl. No.: 15/622,034

(22) Filed: Jun. 13, 2017

(65) Prior Publication Data

US 2017/0365757 A1    Dec. 21, 2017

(30) Foreign Application Priority Data

Jun. 15, 2016   (JP) ................. 2016-119155

(51) Int. Cl.
| | |
|---|---|
| G01V 8/00 | (2006.01) |
| H01L 33/56 | (2010.01) |
| H01L 25/075 | (2006.01) |
| H01L 33/36 | (2010.01) |
| H01L 33/48 | (2010.01) |
| H01L 33/62 | (2010.01) |
| H01L 33/22 | (2010.01) |
| H01L 33/40 | (2010.01) |
| H01L 33/42 | (2010.01) |

(52) U.S. Cl.
CPC .......... *H01L 33/56* (2013.01); *H01L 25/0753* (2013.01); *H01L 33/36* (2013.01); *H01L 33/22* (2013.01); *H01L 33/405* (2013.01); *H01L 33/42* (2013.01); *H01L 33/486* (2013.01); *H01L 33/62* (2013.01); *H01L 2933/0066* (2013.01)

(58) Field of Classification Search
CPC ...... H01L 33/36; H01L 25/0753; H01L 33/56
USPC ..................................... 250/559.34
See application file for complete search history.

(56) References Cited

U.S. PATENT DOCUMENTS 5,989,995 A * 11/1999 Nishiura ............... H01L 24/48
                                              438/617
2005/0121688 A1  6/2005 Nagai et al.
2005/0253151 A1 11/2005 Sakai et al.
2006/0163602 A1  7/2006 Isokawa
(Continued)

FOREIGN PATENT DOCUMENTS

JP  H10-189641 A   7/1998
JP  2003-249112 A  9/2003
(Continued)

*Primary Examiner* — Georgia Y Epps
*Assistant Examiner* — Kevin Wyatt
(74) *Attorney, Agent, or Firm* — Foley & Lardner LLP (57) ABSTRACT

A light emitting device includes a resin package including: a first lead and a second lead, each including a top surface and a bottom surface, and a first resin portion located between the first lead and the second lead and extending in a first direction; a first light emitting element and a second light emitting element arrayed on the top surface of the first lead in the first direction, the first light emitting element and the second light emitting element each including at least a first side surface; and an encapsulant located on the top surface of the first lead and covering the first light emitting element and the second light emitting element. The first side surface of the first light emitting element and the first side surface of the second light emitting element partially face each other.

19 Claims, 8 Drawing Sheets

(56) References Cited

U.S. PATENT DOCUMENTS

| | | | |
|---|---|---|---|
| 2007/0262339 A1* | 11/2007 | Hussell | C09K 11/7731 257/99 |
| 2008/0117649 A1 | 5/2008 | Tanaka et al. | |
| 2008/0128718 A1* | 6/2008 | Sumitani | H01L 25/0753 257/89 |
| 2008/0258156 A1* | 10/2008 | Hata | H01L 33/20 257/88 |
| 2012/0319150 A1* | 12/2012 | Shimomura | H01L 33/486 257/98 |
| 2013/0299860 A1* | 11/2013 | Mineshita | H01L 33/56 257/98 |
| 2014/0008672 A1* | 1/2014 | Takao | H01L 25/0753 257/89 |
| 2014/0027794 A1 | 1/2014 | Yagi et al. | |
| 2014/0175595 A1 | 6/2014 | Oka | |
| 2014/0197431 A1* | 7/2014 | Oka | H01L 25/0753 257/88 |
| 2015/0162509 A1 | 6/2015 | Kuramoto et al. | |
| 2016/0072028 A1 | 3/2016 | Naka | |

FOREIGN PATENT DOCUMENTS

| | | |
|---|---|---|
| JP | 2005-005433 A | 1/2005 |
| JP | 2005-109212 A | 4/2005 |
| JP | 2008-130628 A | 6/2008 |
| JP | 2009-246407 A | 10/2009 |
| JP | 2009-267423 A | 11/2009 |
| JP | 2011-109143 A | 6/2011 |
| JP | 2012-204558 A | 10/2012 |
| JP | 2013-004807 A | 1/2013 |
| JP | 2014-042012 A | 3/2014 |
| JP | 2014-143396 A | 8/2014 |
| JP | 2015-032869 A | 2/2015 |
| JP | 2015-109354 A | 6/2015 |
| JP | 2005-191530 A | 7/2015 |
| JP | 2016-054251 A | 4/2016 |

\* cited by examiner

LIGHT EMITTING DEVICE

CROSS-REFERENCE TO RELATED APPLICATION

This application claims priority to Japanese Patent Application No. 2016-119155, filed on Jun. 15, 2016, the disclosure of which is hereby incorporated by reference in its entirety.

BACKGROUND

The present disclosure relates to a light emitting device.

A light emitting device including a semiconductor light emitting element such as a light emitting diode (LED) or the like has been used more and more for various uses instead of a conventional light source. Recently, a light emitting device including a semiconductor light emitting element has been used more and more especially for a device required to provide high luminance, for example, a backlight unit, an lighting device, an interior or exterior lighting for vehicles, or the like.

A light emitting device for such an application includes a plurality of semiconductor light emitting elements in order to increase the luminance. Japanese Patent Publication No. 2009-267423 and Japanese Patent Publication No. 2011-109143, for example, describe a known light emitting device including a plurality of semiconductor light emitting elements having a quadrangular shape as seen in a plan view, which are arranged in a row direction or a column direction.

SUMMARY

A high-luminance light emitting device generates a large amount of heat and thus is required to have resistance in accordance with the amount of heat generation.

Certain embodiments of the present disclosure provide a light emitting device having resistance against heat generation and light emission.

A light emitting device according to the present disclosure includes a resin package including a first lead and a second lead each including a top surface and a bottom surface, and a first resin portion located between the first lead and the second lead and extending in a first direction; a first light emitting element and a second light emitting element arrayed on the top surface of the first lead in the first direction, the first light emitting element and the second light emitting element each including at least a first side surface; and a encapsulant located on the top surface of the first lead and covering the first light emitting element and the second light emitting element. The first side surface of the first light emitting element and the first side surface of the second light emitting element partially face each other; and a part of the first side surface of the first light emitting element and a part of the first side surface of the second light emitting element are located on the same straight line extending in a second direction perpendicular to the first direction on the top surface of the first lead.

According to certain embodiments of the present disclosure, a highly durable light emitting device incorporating an encapsulant which is inhibited from being degraded by heat generation and light emission.

DETAILED DESCRIPTION

In order to increase the luminance of light provided by a light emitting device, it may be desirable to locate a plurality of light emitting elements in a small area. If, in such a case, the plurality of light emitting elements, for example, two light emitting elements, are located such that a side surface of a first of the light emitting elements faces a side surface of the other light emitting element, heat is easily accumulated and light is easily concentrated in a region where the side surfaces face each other. Therefore, among various parts of an encapsulant covering the light emitting elements, a part that is located in the region where the side surfaces face each other is easily degraded by the heat and light, and may be, for example, cracked. In this specification, the concept represented by the expression that "two light emitting elements are located such that a side surface of a first of the light emitting elements faces a side surface of a second of the light emitting elements" encompasses a state where these side surfaces are parallel to each other and face each other, and also a state where a line perpendicular to a first side surface of a first of the two light emitting elements reaches a first side surface of a second of the light emitting elements, and a line perpendicular to the first side surface of the second light emitting element reaches the first side surface of the first light emitting element.

A light emitting device according to certain embodiments of the present disclosure inhibits heat and light from being concentrated and inhibits an encapsulant from being degraded by the heat and the light, even in a state where side surfaces of two emitting elements partially face each other.

Hereinafter, embodiments of the present disclosure will be described in detail with reference to the drawings. The following embodiments are merely examples, and the light emitting device according to the present disclosure is not limited to any of the following embodiments. In the following description, terms representing a specific direction or position (e.g., "up", "down", "right", "left" or another term including such a term) will be used. Such terms will be merely used for easier understanding of a relative direction or position in any of the drawings referred to. In a drawing other than those in the present disclosure, in an actual product or the like, components merely need to have a directional or positional relationship represented by the term "up", "down" or the like used regarding the drawing(s) referred to, but do not need to be located exactly as in the drawing(s) referred to. In the drawings, sizes, positions or the like of the components may be exaggerated for easier understanding, and may not reflect sizes, positions or the like of components in an actual light emitting device. In this disclosure, the concept represented by the term "parallel" encompasses a state where two straight lines, two sides, two planes or the like have an angle of about 0°±5° with respect to each other unless otherwise specified. The concept represented by the term "perpendicular" encompasses a state where two straight lines, two sides, two planes or the like have an angle of about 90°±5° with respect to each other unless otherwise specified.

Embodiment

Figure 1A:
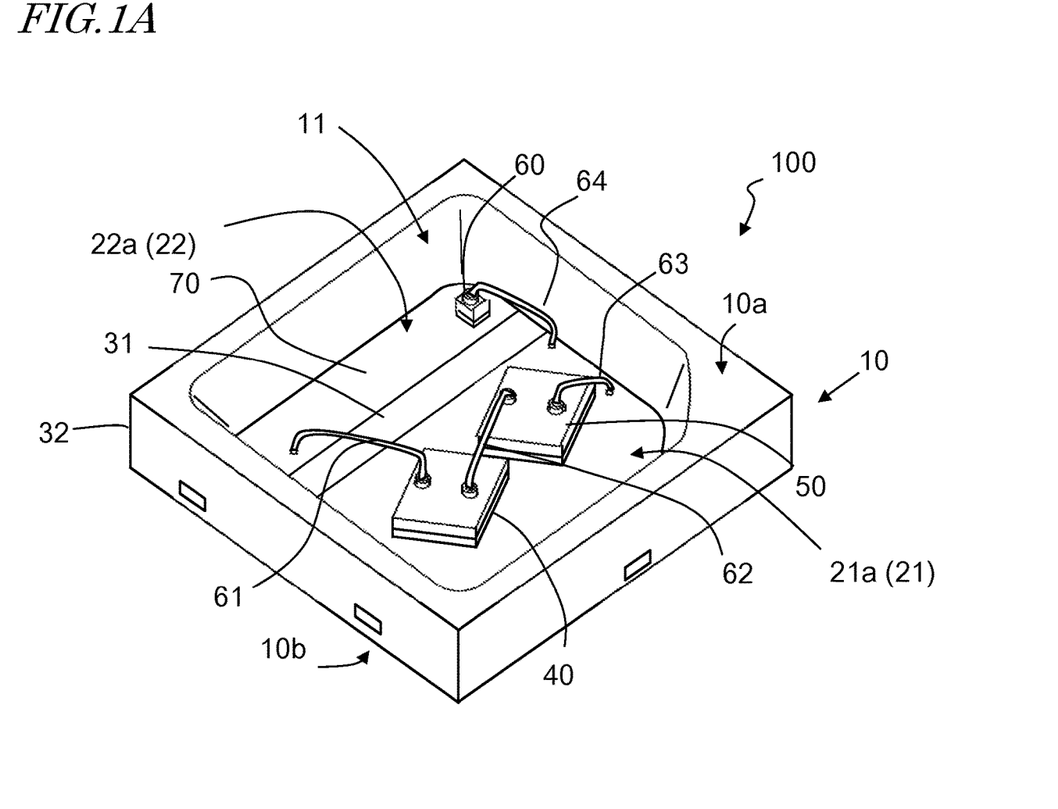
FIG. 1A is a schematic perspective view of a light emitting device in an embodiment according to the present disclosure, as seen from above.
Figure 1B:
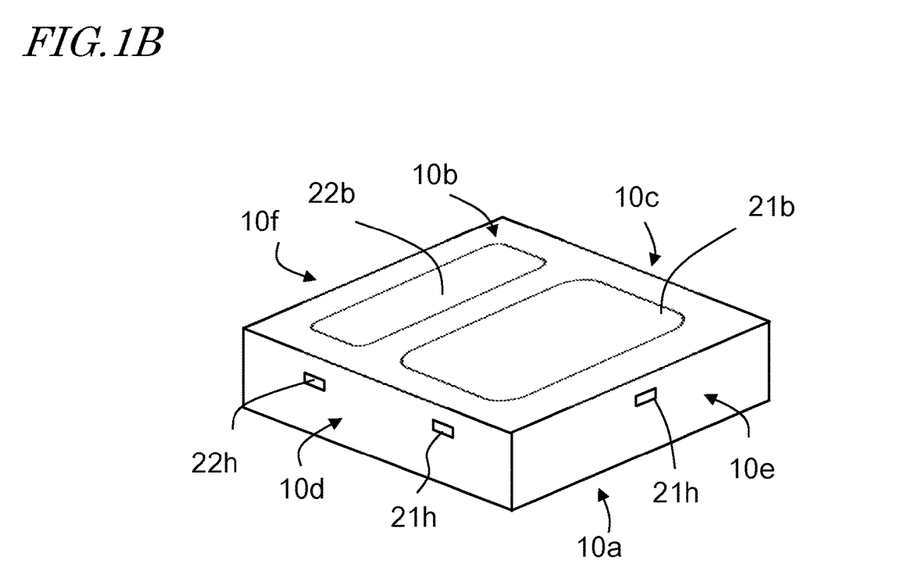
FIG. 1B is a schematic perspective view of the light emitting device in the embodiment according to the present disclosure, as seen from below.

FIG. 1A and FIG. 1B are schematic perspective views of a light emitting device 100 as seen from above and as seen from below respectively. The light emitting device 100 includes a resin package 10, a first light emitting element 40, a second light emitting element 50, and an encapsulant 70. The resin package 10 includes a top surface 10a and a bottom surface 10b. The top surface 10a has a recessed portion 11 formed therein, and the first light emitting element 40 and the second light emitting element 50 are located in the recessed portion 11. The encapsulant 70 is also located in the recessed portion 11 of the resin package 10. FIG. 1A shows the encapsulant 70 as being transparent in order to show the first light emitting element 40 and the second light emitting element 50 located in the recessed portion 11. Hereinafter, each of the components of the light emitting device 100 will be described in detail.

Resin Package 10

Figure 2A:
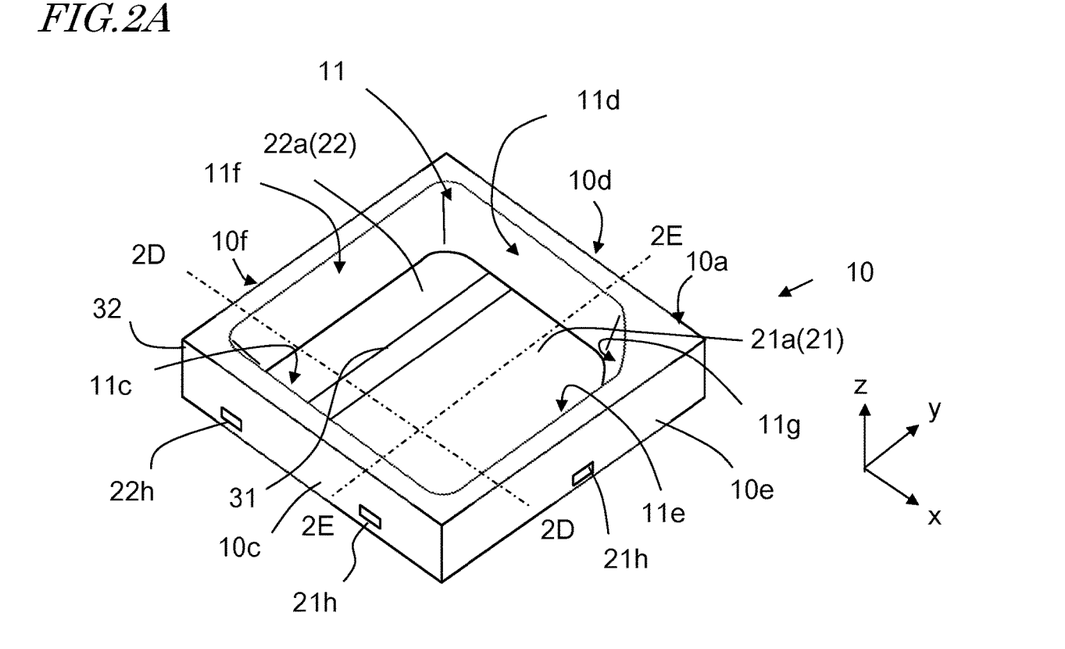
FIG. 2A is a schematic see-through view of a resin package of the light emitting device in the embodiment according to the present disclosure.
Figure 2B:
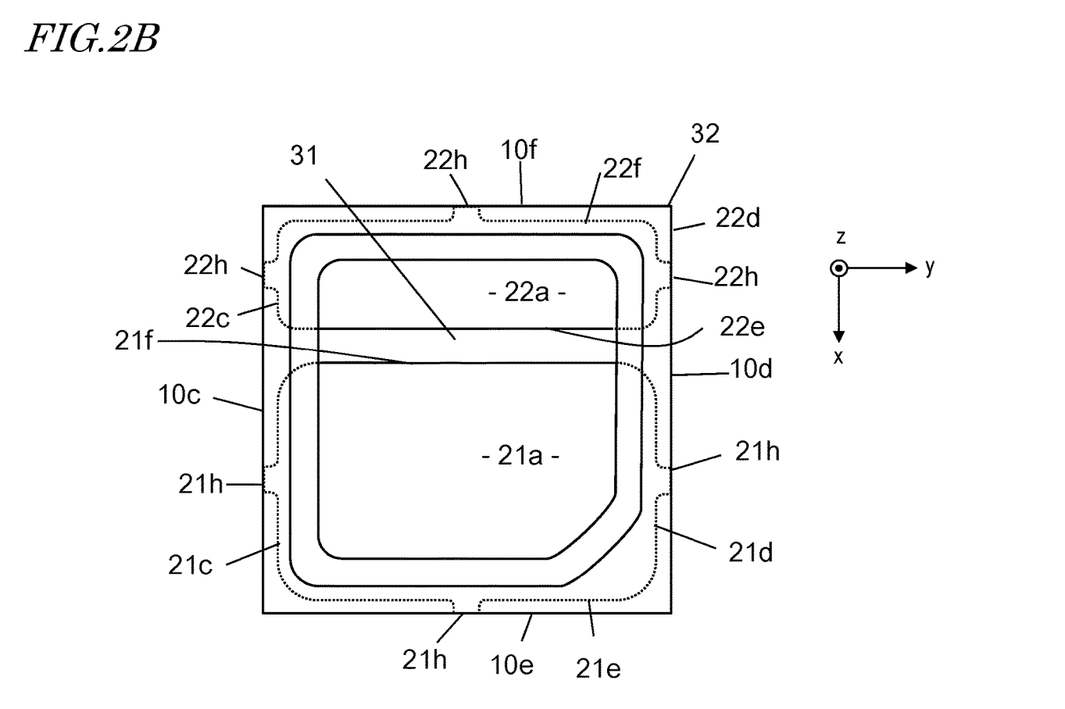
FIG. 2B is a schematic plan view of the resin package shown in FIG. 2A.
Figure 2C:
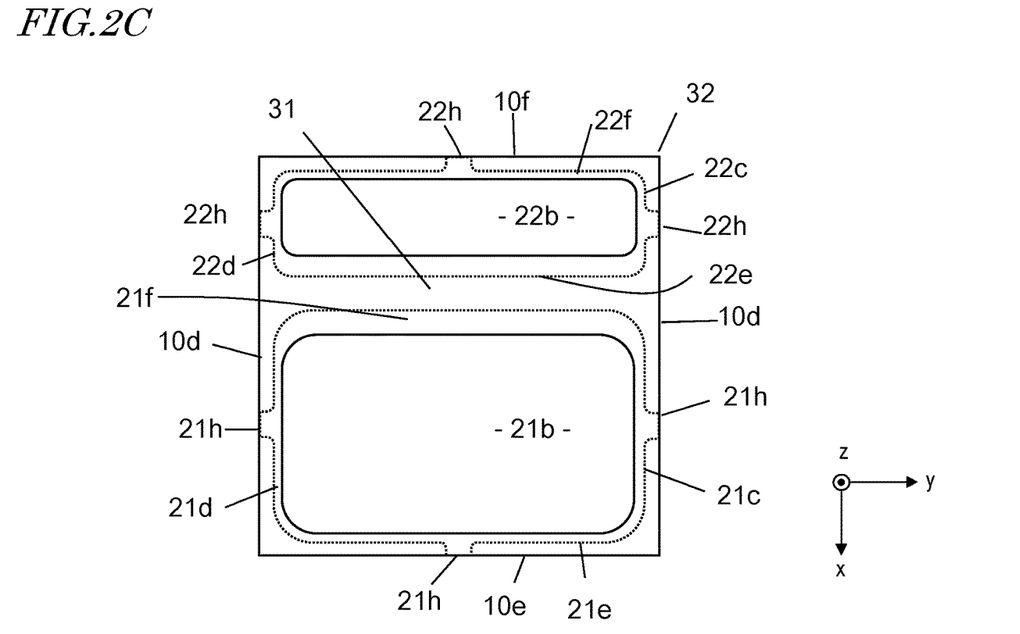
FIG. 2C is a schematic bottom view of the resin package shown in FIG. 2A.
Figure 2D:
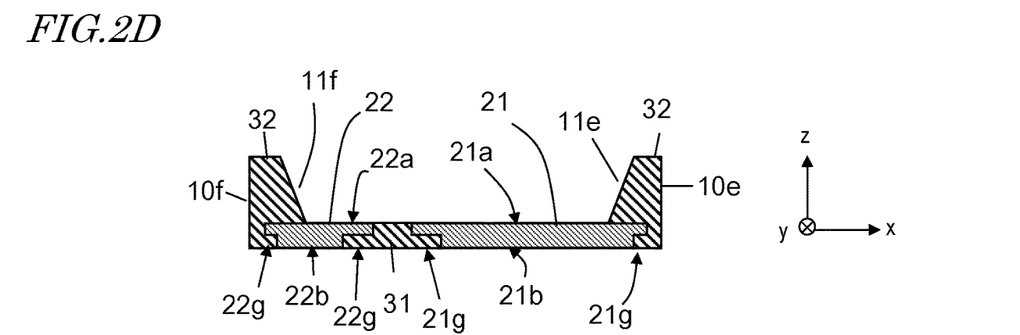
FIG. 2D is a schematic view of a section taken along line 2D-2D in FIG. 2A.
Figure 2E:
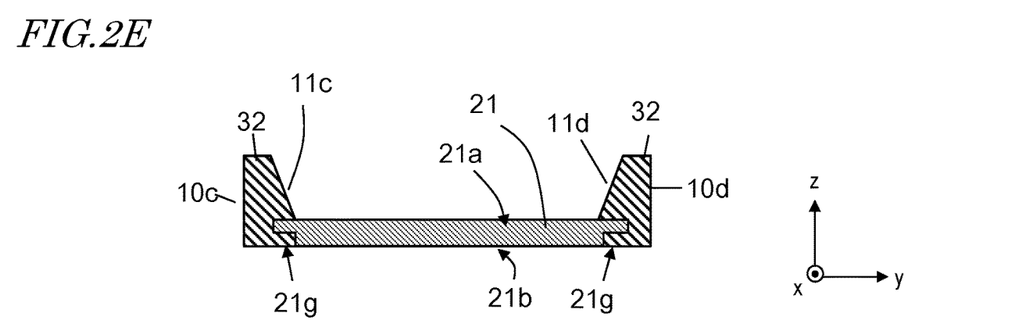
FIG. 2E is a schematic view of a section taken along line 2E-2E in FIG. 2A.

FIG. 2A is a schematic perspective view of the resin package 10, and FIG. 2B and FIG. 2C are respectively a plan view and a bottom view of the resin package 10. FIG. 2D is a view of a section taken along line 2D-2D in FIG. 2A, and FIG. 2E is a view of a section taken along line 2E-2E in FIG. 2A.

In this embodiment, the resin package 10 has a approximately parallelepiped shape. Therefore, the resin package 10 includes an outer side surface 10c, an outer side surface 10d opposite to the outer side surface 10c, an outer side surface 10e located between the outer side surface 10c and the outer side surface 10d, and an outer side surface 10f opposite to the outer side surface 10e. The top surface 10a and the bottom surface 10b are quadrangular in shape as seen in a plan view. Alternatively, as seen in a plan view, the plan surface 10a and the bottom surface 10b may have a shape other than a quadrangular shape, for example, may be approximately triangular, approximately quadrangular, approximately pentagonal or approximately hexagonal or may have another polygonal shape or a shape including a curved line, such as a circular shape, an elliptical shape or the like.

The recessed portion 11 includes an anode mark or a cathode mark. More specifically, the recessed portion 11 is opened upward, and the opening has a approximately quadrangular shape having one corner thereof chamfered as seen in a plan view. This chamfered corner is used as an anode mark or a cathode mark, which acts as a mark representing a polarity of two leads described below. Instead of using a shape of the opening of the recessed portion 11 to indicate the polarity of two leads, the opening of the recessed portion 11 may have a approximately quadrangular shape with no chamfered corner, and an anode mark or a cathode mark may be provided outward of the opening. In this embodiment, the recessed portion 11 has a cathode mark formed as a result of one corner of the opening being chamfered as seen in a plan view.

The resin package 10 includes a first resin portion 31, a second resin portion 32, a first lead 21, and a second lead 22. The first resin portion 31 and the second resin portion 32 are formed integrally with the first lead 21 and the second lead 22.

First Resin Portion 31

The first resin portion 31 is located on a bottom surface of the recessed portion 11 of the resin package 10. As described below, the first resin portion 31 is located between the first lead 21 and the second lead 22, and extends in a first direction. As shown in FIG. 2A, x axis is defined as being parallel to the top surface 10a and also parallel to the outer side surface 10c, y axis is defined as being parallel to the top surface 10a and also parallel to the outer side surface 10f, and z axis is defined as being perpendicular to the x and y axes. The first direction is a y axis direction. The first resin portion 31 needs only include at least a straight portion extending in the first direction as seen in a plan view, and may include another portion bent with respect to the straight portion. In the resin package 10 in this embodiment, the first resin portion 31 located on the bottom surface of the recessed portion 11 is formed of a starlight portion along an inner side surface 11d and an inner side surface 11e of the recessed portion 11.

Second Resin Portion 32

As shown in FIG. 2A, the second resin portion 32 has a frame shape enclosing the recessed portion 11 as seen in a plan view. The second resin portion 32 defines the outer side surfaces 10c through 10f of the resin package 10 and inner side surfaces of the recessed portion 11.

The inner side surfaces of the recessed portion 11 are located opposite to the outer side surfaces 10c through 10f defined by the second resin portion 32. Specifically, inner side surfaces 11c through 11f are located respectively opposite to the outer side surfaces 10c through 10f. An inner side surface 11g is located at the above-described one corner of the approximately quadrangular opening of the recessed portion 11. The inner side surfaces 11c through 11g are preferably inclined outward from the bottom surface toward the open end of the recessed portion 11. With this structure, light from the first light emitting element 40 and the second light emitting element 50 located in the recessed portion 11 is efficiently reflected toward the opening. Alternatively, the inner side surfaces 11c through 11f may be perpendicular to the top surface 10a. In this case, the area of the opening of the recessed portion 11a is decreased, and an area of a region where light output from the light emitting device 100 is emitted is decreased. Therefore, the light emitting device 100 is made more like a point light source.

First Lead 21, Second Lead 22

The first lead 21 include a top surface 21a and a bottom surface 21b located opposite to the top surface 21a. The second lead 22 include a top surface 22a and a bottom surface 22b located opposite to the top surface 22a. The first lead 21 and the second lead 22 are located such that the first resin portion 31 interposing between the bottom surface 21b and the bottom surface 22b while the bottom surfaces 21b and 22b are approximately at the same plane.

A part of the top surface 21a of the first lead 21 and a part of the top surface 22a of the second lead 22 are exposed to the bottom surface of the recessed portion 11 of the resin package 10.

The first lead 21 and the second lead 22 are electrically conductive and each act as an electrode that supplies electric power to the first light emitting element 40, the second light emitting element 50 and the like. The light emitting device 100 may include a third lead in addition to the first lead 21 and the second lead 22. The third lead may act as an electrode or a heat dissipation member having a high thermal conductivity. The light emitting device 100 may include four or more leads.

As shown in FIG. 1B, a part of the bottom surface 21b of the first lead 21 and a part of the bottom surface 22b of the second lead 22 are exposed on the bottom surface 10b of the resin package 10. This will be described in more detail. As shown in FIG. 1A, the first light emitting element 40 and the second light emitting element 50 are located on a part of the top surface 21a of the first lead 21, among various parts of the top surface 21a of the first lead 21 and the top surface 22a of the second lead 22. It is preferable that a part of the bottom surface 21b that is opposite to the above-described part (namely, opposite to the part of the top surface 21a on which the first light emitting element 40 and the second light emitting element 50 are located) is exposed to the bottom surface 10b. With this structure, heat from the first light emitting element 40 and the second light emitting element 50 is efficiently output to the outside.

As shown in FIG. 2B, the first lead 21 has a approximately quadrangular shape as seen in a plan view. This quadrangular shape is defined by sides 21c, 21d, 21e and 21f. As shown in FIG. 2D and FIG. 2E, a side groove 21g is provided in the sides 21c through 21f on the side of the bottom surface 21b. Extended portions 21h are provided respectively on the sides 21c, 21d and 21e, more specifically, at, or in the vicinity of, the center of the sides 21c, 21d and 21e as seen in a plan view. The extended portions 21h extend from a main portion of the first lead 21 having the approximately quadrangular shape toward the outer side surfaces 10c, 10d and 10e of the resin package 10. End surfaces of the extended portions 21h on the sides 21c, 21d and 21e are exposed on the outer side surfaces 10c, 10d and 10e of the resin package 10. In the resin package 10 shown in FIG. 2A and FIG. 2B, the outer side surfaces 10c, 10d and 10e of the resin package 10 and the end surfaces of respective the extended portions 21h are at the same plane. This is because the first lead 21 and the second resin portion 32 are cut in the same cutting step. The side groove 21g may be formed by etching, pressing or the like.

Similarly, the second lead 22 has a approximately quadrangular shape as seen in a plan view. This quadrangular shape is defined by sides 22c, 22d, 22e and 22f. A side groove 22g is provided in the sides 22c through 22f on the side of the bottom surface 22b. Extended portions 22h are provided respectively on the sides 22c, 22d and 22f, more specifically, at, or in the vicinity of, the center of the sides 22c, 22d and 22f as seen in a plan view. The extended portions 22h extend from a main portion of the second lead 22 having the approximately quadrangular shape toward the outer side surfaces 10c, 10d and 10f of the resin package 10. End surfaces of the extended portions 22h on the sides 22c, 22d and 22f are exposed on the outer side surfaces 10c, 10d and 10f of the resin package 10.

In the resin package 10 shown in FIG. 2A and FIG. 2B, the outer side surfaces 10c, 10d and 10f of the resin package 10 and the respective end surfaces of the extended portions 22h are at the same plane. This is because the second lead 22 and the second resin portion 32 are cut in the same cutting step. The side 21f of the first lead 21 and the side 22e of the second lead 22 face each other while having the first resin portion 31 therebetween.

The side grooves 21g and 22g formed in the first lead 21 and the second lead 22 are provided in order to, for example, improve the adhesion between leads and resin portions.

A plurality of the extended portions 21h and 22h are parts of connection portions which are provided in a lead frame and connect the first lead 21 and the second lead 22 with the lead frame. The light emitting device 100 is produced as follows. In a state where a plurality of the first leads 21 and a plurality of the second leads 22 are held in the lead frame via the connection portion, the first resin portion 31 and the second resin portions 32 are formed integrally with the first leads 21 and the second leads 22; and then connection portions are cut into pieces to produce singulated light emitting devices 100. Therefore, the extended portions 21h and 22h are exposed on the outer side surfaces 10c, 10d, 10e and 10f of the resin package 10.

In this embodiment, the first lead 21 has a larger area than that of the second lead 22. A portion of the first lead 21 exposed in the bottom surface of the recessed portion 11 has a larger area than that of a portion of the second lead 22 exposed in the bottom surface of the recessed portion 11. Such a structure is provided in order to allow both of the first light emitting element 40 and the second light emitting element 50 to be placed on the first lead 21 exposed on the bottom surface of the recessed portion 11. In the case where a plurality of light emitting elements are to be placed on only the first lead 21 or only the second lead 22, one of the first lead 21 and the second lead 22 may have a larger area than that of the other of the first lead 21 and the second lead 22 depending on the number of the light emitting elements.

The first lead 21 and the second lead 22 may each include a base member and a metal layer covering a surface of the base member. The base member contains a metal material such as, for example, copper, aluminum, gold, silver, iron, nickel, an alloy of any of those, phosphor bronze, iron-containing copper, or the like. Such a material may be of a single layer or of a multilayer structure (e.g., clad material). Especially preferably, the base member is formed of copper. The metal layer is, for example, a plated layer. The metal layer contains, for example, silver, aluminum, nickel, palladium, rhodium, gold, copper, an alloy of any or them, or the like. The first lead 21 and the second lead 22 may each include a region without the metal layer. Alternatively, the first lead 21 and the second lead 22 may each formed of only the base member with no metal layer. The end surfaces of the extended portions 21h and 22h exposed on the outer side surfaces 10c through 10f of the resin package 10 are formed by the cutting step, and therefore, are not provided with a metal layer. After the cutting step, a step of forming the metal layer on the end surfaces of the extended portions 21h and 22h respectively exposed on the outer side surfaces 10c through 10f of the resin package 10 may be performed.

Materials of First Resin Portion 31 and Second Resin Portion 32, and Formation of Resin Package 10

The first resin portion 31 and the second resin portion 32 are formed integrally with the first lead 21 and the second lead 22, and thus form a package in which the first light emitting element 40 and the second light emitting element 50 are mountable. As a base material, the first resin portion 31 and the second resin portion 32 may contain a thermosetting resin, a thermoplastic resin or the like. Specific examples of the resin usable as the base material of the first resin portion 31 and the second resin portion 32 include an epoxy resin composition, a silicone resin composition, a modified epoxy resin composition such as a silicone-modified epoxy resin composition or the like, a modified silicone resin composition such as epoxy-modified silicone resin composition or the like, an unsaturated polyester resin, a saturated polyester resin, a polyimide resin composition, a modified polyimide resin composition or the like, polyphthalamide (PPA), polyamide (PA), a polycarbonate resin, polyphenylenesulfide (PPS), a liquid crystal polymer (LCP), an ABS resin, a phenol resin, an acrylic resin, a PBT resin, and the like. It is especially preferable to use a thermosetting resin.

Preferably, the first resin portion 31 and the second resin portion 32 each further contain a light reflective substance. Examples of the light reflective substance include titanium oxide, silicon oxide, zirconium oxide, potassium titanate, aluminum oxide, zinc oxide, aluminum nitride, boron nitride, mullite, and the like. Containing a light reflective substance, the first resin portion 31 and the second resin portion 32 can efficiently reflect light from the first light emitting element 40 and the second light emitting element 50. For example, in case of titanium oxide, it is contained preferably at a content of 20 mass % or greater and 60 mass % by weight or less, and more preferably at a content of 25% by weight or greater and 55% by weight or less, with respect to the total weight of the first resin portion 31 and the second resin portion 32. The first resin portion 31 and the second resin portion 32 have a reflectance of, preferably 60% or greater, and more preferably 90% or greater, for light from the first light emitting element 40 and the second light emitting element 50.

First Light Emitting Element 40 and Second Light Emitting Element 50

The first light emitting element 40 and second light emitting element 50 may each be a semiconductor light emitting element such as a light emitting diode or the like. It is especially preferable that the first light emitting element 40 and second light emitting element 50 may be a nitride semiconductor ($In_xAl_yGa_{1-x-y}N$, $0 \leq x$, $0 \leq y$, $x+y \leq 1$), which is capable of emitting light having a wavelength in an ultraviolet range to a visible range. The first light emitting element 40 and the second light emitting element 50 may emit light having the same wavelength or may emit light having different wavelengths. For example, the first light emitting element 40 and the second light emitting element 50 may each be a blue light emitting element that emits blue light. Alternatively, the first light emitting element 40 may be a blue light emitting element that emits blue light, whereas the second light emitting element 50 may be a green light emitting element that emits green light. The light emitting device 100 in this embodiment is especially effective when including a light emitting element having a high output. The light emitting device 100 may include three or more light emitting elements. The light emitting device 100 may include a third light emitting element in addition to the first light emitting element 40 and the second light emitting element 50. Such a plurality of light emitting elements may be connected in series or in parallel by a wire or the like.

Figure 3A:
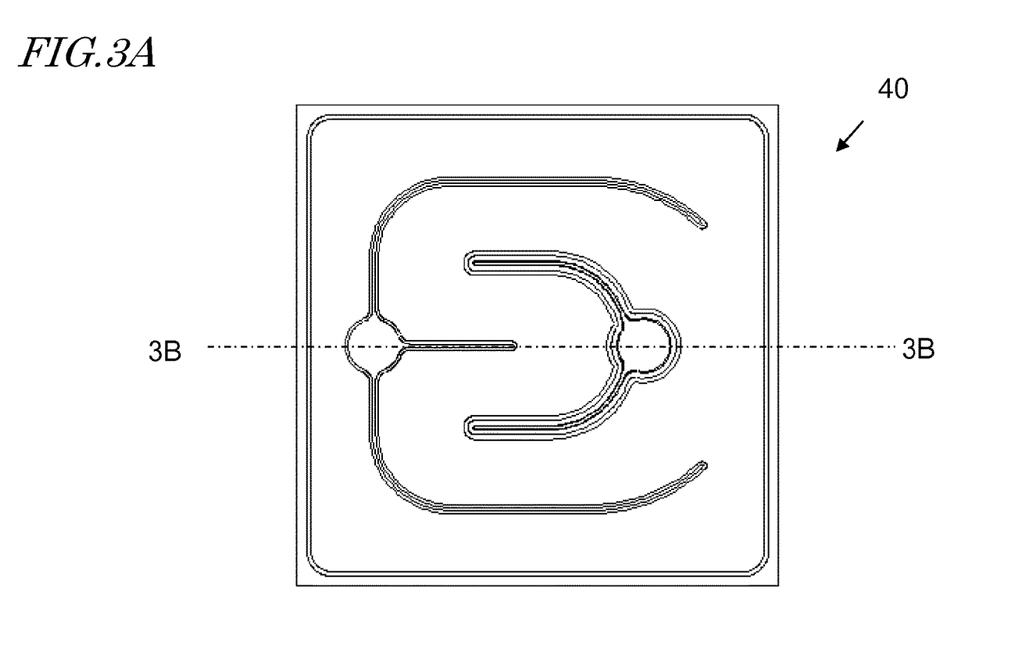
FIG. 3A is a schematic plan view of a first light emitting element in the light emitting device in the embodiment according to the present disclosure.
Figure 3B:
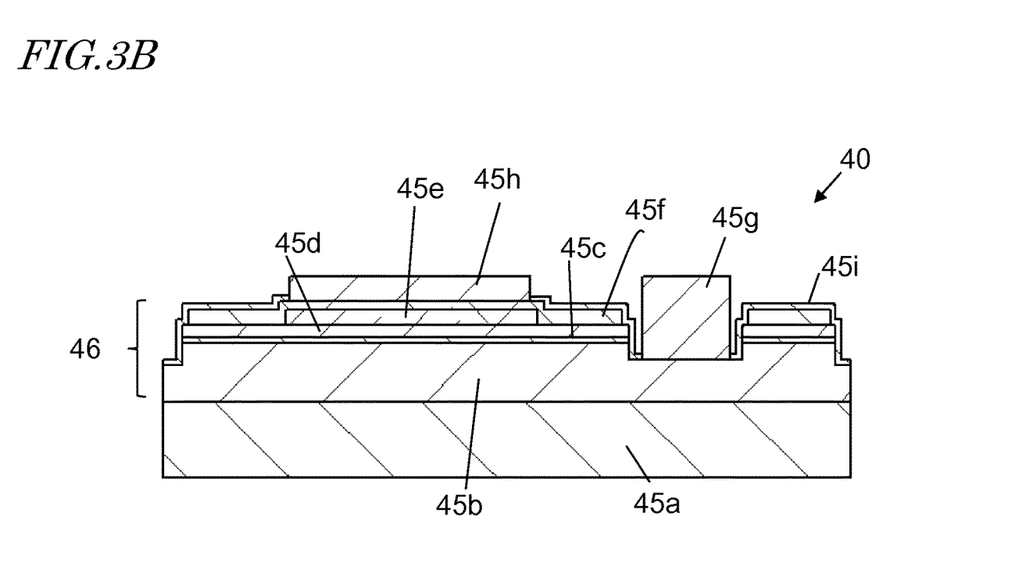
FIG. 3B is a schematic cross-sectional view of the first light emitting element taken along line 3B-3B in FIG. 3A.

FIG. 3A is a plan view showing an example of the first light emitting element 40, and FIG. 3B is a cross-sectional view taken along line 3B-3B in FIG. 3A. In FIG. 3B, the scale, the positional relationship and the like of components are exaggerated, or a part of the components are omitted, for clear illustration of the components in the figure. The first light emitting element 40 includes a substrate 45a and a semiconductor layered portion 46 located on the substrate 45a. The semiconductor layered portion 46 includes an n-type semiconductor layer 45b, an active layer 45c, a p-type semiconductor layer 45d, and an insulating layer 45e. The n-type semiconductor layer 45b is electrically connected with an n-side electrode 45g. A transparent electrode 45f is provided to cover the p-type semiconductor layer 45d and the insulating layer 45e. The transparent electrode 45f is electrically connected with a p-side electrode 45h. Parts of the transparent electrode 45f and the semiconductor layered portion 46 are covered with a protective film 45i. The second light emitting element 50 has substantially the same structure as that of the first light emitting element 40.

The first light emitting element 40 and the second light emitting element 50 are located in the recessed portion 11 of the resin package 10 in such a manner as to meet a specific condition.

As shown in FIG. 1A, the first light emitting element 40 and the second light emitting element 50 are joined to the top surface 21a of the first lead 21 by a joining member formed of resin, solder, conductive paste or the like.

The first light emitting element 40 and the second light emitting element 50 are connected with the first lead 21 and the second lead 22 by wires. For example, one end of a wire 61 is connected with the top surface 22a of the second lead 22, and the other end of the wire 61 is connected with the p-side electrode 45h of the first light emitting element 40. One end of a wire 62 is connected with the n-side electrode 45g of the first light emitting element 40, and the other end of the wire 62 is connected with a p-side electrode of the second light emitting element 50.

One end of a wire 63 is connected with an n-side electrode of the second light emitting element 50, and the other end of the wire 63 is connected with the top surface 21a of the first lead 21. The wires 61 through 63 and a wire 64 described below may each be a metal wire of gold, silver, copper, platinum, aluminum or an alloy of any of those. Among such wires, it is preferable to use a gold wire, which is highly ductile, or a gold-silver alloy wire, which has a higher reflectance than that of the gold wire. The wires 61 through 64 may each have any shape. As shown in FIG. 1A, the wires 61 through 64 each have a approximately straight portion and a portion bent from the straight portion (herein after referred to as "bent portion").

Protective Element 60

The light emitting device 100 may include a protective element 60 in order to improve the electrostatic discharge. The protective element 60 may be selected from various protective elements mountable on a general light emitting device. For example, a Zener diode may be used as the protective element 60. In the light emitting device 100, the protective element 60 is connected parallel to the first light emitting element 40 and the second light emitting element 50, which are connected in series to each other.

The protective element 60 is jointed to, for example, the top surface 22a of the second lead 22. One of two terminals of the protective element 60 is electrically and physically connected with the top surface 22a of the second lead 22 by, for example, a conductive joining member. The other end of the protective element 60 is electrically connected with the top surface 21a of the first lead 21 by the wire 64.

Encapsulant 70

The encapsulant 70 covers the first light emitting element 40 and the second light emitting element 50, and is provided in the recessed portion 11. The encapsulant 70 protects the first light emitting element 40 and the second light emitting element 50 against an external force, dust, moisture or the like, and improves the heat resistance, the weather resistance and light resistance of the first light emitting element 40 and the second light emitting element 50.

The encapsulant 70 preferably transmits 60% or greater, more preferably 70% or greater, still more preferably 80% or greater, and still more preferably 90% or greater, of light emitted from the first light emitting element 40 and the second light emitting element 50. The encapsulant 70 may be formed of any of the materials usable for the first resin portion 31 and the second resin portion 32. A base material of the encapsulant 70 may contain a thermosetting resin, a thermoplastic resin or the like, specifically, for example, a silicone resin, an epoxy resin, an acrylic resin or a resin containing at least one thereof. The encapsulant 70 may be of a single layer or may include a plurality of layers. The encapsulant 70 may contain light scattering particles formed of titanium oxide, silicon oxide, zirconium oxide, aluminum oxide or the like dispersed therein.

In the encapsulant 70, particles of a material converting the wavelength of light from the first light emitting element 40 and the second light emitting element 50 (e.g., fluorescent material, etc.) are contained and dispersed therein. Specific examples of the fluorescent material include yttrium-aluminum-garnet activated by cerium, lutetium-aluminum-garnet activated by cerium, nitrogen-containing calcium aluminosilicate (calcium may partially be substituted with strontium) activated by europium and/or chromium, SiAlON activated by europium, silicate activated by europium, strontium aluminate activated by europium, potassium fluorosilicate activated by manganese, and the like.

The light scattering particles and/or the fluorescent particles may be preferably contained at a content of, for example, 10 to 100 mass % with respect to the total weight of the encapsulant 70.

Protective Film

The light emitting device 100 may include a protective film of silicon oxide or the like provided on respective surfaces of the first lead 21, the second lead 22, the first light emitting element 40 and the second light emitting element 50. Especially in the case where a silver plating layer is provided on a surface of the first lead 21 and the second lead 22, the protective film may be used to protect a surface of the silver plating layer, thereby inhibiting the silver plating layer from being discolored by a sulfur or the like in the air. The protective film may be formed by a film formation method using a vacuum process such as sputtering, or other known methods.

Positional Arrangement of First Light Emitting Element 40 and Second Light Emitting Element 50

Figure 4A:
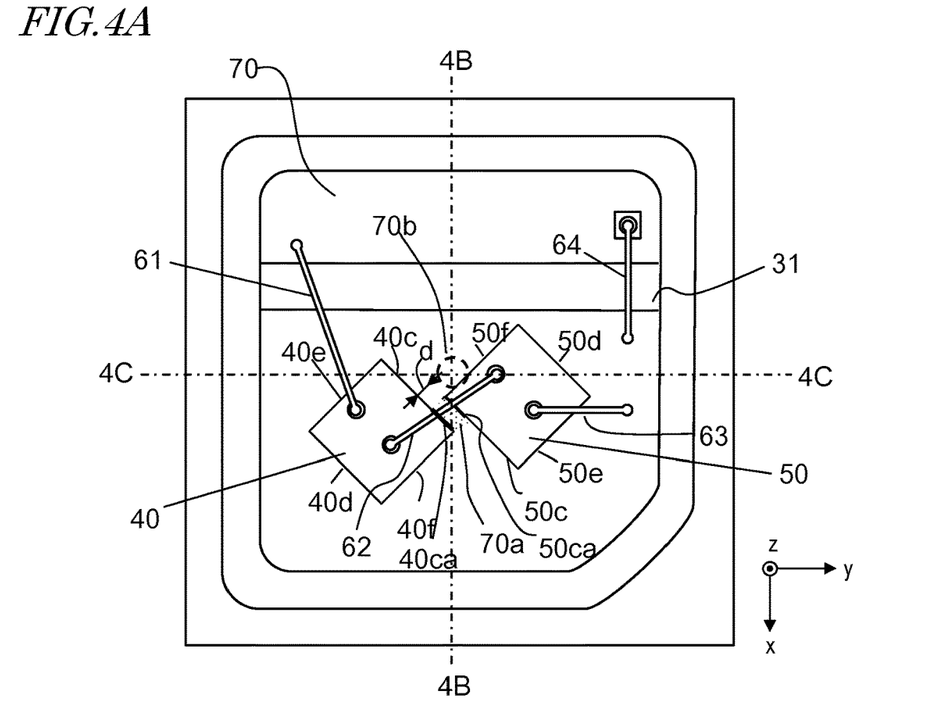
FIG. 4A is a schematic plan view of the light emitting device in the embodiment according to the present disclosure.
Figure 4B:
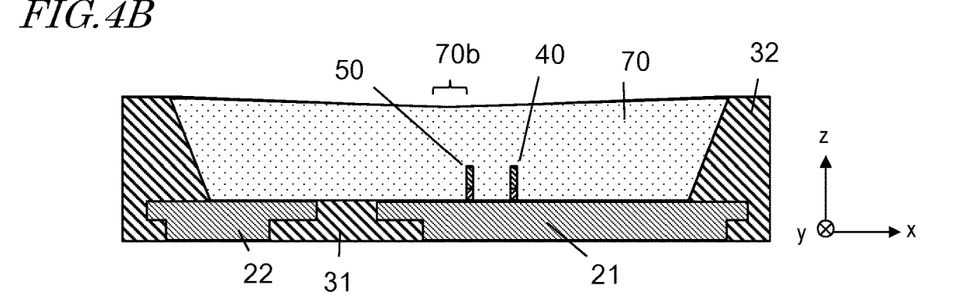
FIG. 4B is a schematic cross-sectional view of the light emitting device taken along line 4B-4B in FIG. 4A.
Figure 4C:
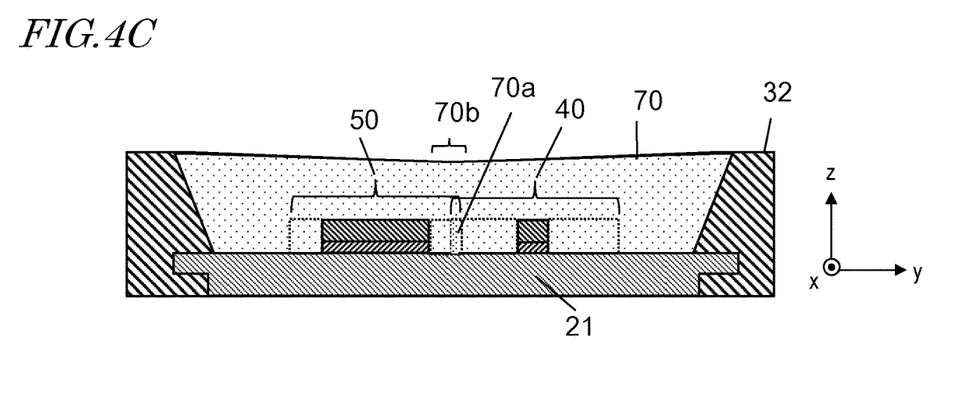
FIG. 4C is a schematic cross-sectional view of the light emitting device taken along line 4C-4C in FIG. 4A.

FIG. 4A is a plan view of the light emitting device 100, and FIG. 4B and FIG. 4C respectively show cross-sectional views taken along line 4B-4B and line 4C-4C in FIG. 4A. In FIG. 4B and FIG. 4C, the wires 61 through 64 are not shown.

The first light emitting element 40 and the second light emitting element 50 each include at least a first side surface. In this embodiment, the first light emitting element 40 and the second light emitting element 50 are each quadrangular as seen in a plan view, and each have four side surfaces. Specifically, the first light emitting element 40 includes a first side surface 40c, a second side surface 40d, a third side surface 40e and a fourth side surface 40f. The second side surface 40d is opposite to the first side surface 40c, and the fourth side surface 40f is opposite to the third side surface 40e. Similarly, the second light emitting element 50 includes a first side surface 50c, a second side surface 50d, a third side surface 50e and a fourth side surface 50f. The second side surface 50d is opposite to the first side surface 50c, and the fourth side surface 50f is opposite to the third side surface 50e.

The first light emitting element 40 and the second light emitting element 50 are located in the recessed portion 11 of the resin package 10. Specifically, the first light emitting element 40 and the second light emitting element 50 are located on the top surface 21a of the first lead 21 exposed on the bottom surface of the recessed portion 11, and are arrayed in the first direction (i.e., y axis direction). The expression "arrayed in the first direction" indicates that a part of the first light emitting element 40 and a part of the second light emitting element 50 are located on the same straight line parallel to the first direction as seen in a plan view.

As seen in a plan view, the first light emitting element 40 and the second light emitting element 50 are located as being inclining with respect to the first direction. Namely, the side surfaces of the first light emitting element 40 and the second light emitting element 50 are inclined with respect to the first direction. More specifically, as seen in plan view, none of the first side surface 40c, the second side surface 40d, the third side surface 40e and the fourth side surface 40f of the first light emitting element 40 and the first side surface 50c, the second side surface 50d, the third side surface 50e and the fourth side surface 50f of the second light emitting element 50 is parallel or perpendicular to the first direction.

The first side surface 40c of the first light emitting element 40 and the first side surface 50c of the second light emitting element 50 partially face each other. In other words, a part of the first side surface 40c of the first light emitting element 40 does not face the first side surface 50c of the second light emitting element 50, and a part of the first side surface 50c of the second light emitting element 50 does not face the first side surface 40c of the first light emitting element 40. In the case where another light emitting element is provided between the first light emitting element 40 and the second light emitting element 50, none of the side surfaces of the first light emitting element 40 faces any of the side surfaces of the second light emitting element 50. In FIG. 4A, the first side surface 40c of the first light emitting element 40 and the first side surface 50c of the second light emitting element 50 are parallel to each other. Alternatively, the first side surface 40c of the first light emitting element 40 and the first side surface 50c of the second light emitting element 50 do not need to be parallel to each other.

Since the first side surface 40c of the first light emitting element 40 and the first side surface 50c of the second light emitting element 50 face each other merely partially, a portion of the encapsulant 70 in an element facing portion 70a which is located between the first light emitting element 40 and the second light emitting element 50, can be made small. Therefore, the portion of the encapsulant 70 that receives the heat and the light radiating, at the same time, from the first side surface 40c of the first light emitting element 40 and the first side surface 50c of the second light emitting element 50 is made small. As a result, the portion of the encapsulation 70 located in the element facing portion 70a, where the heat and the light are concentrated can be small.

The above-described effect is greater as the element facing portion 70a is smaller. Therefore, the area of a portion, of the first side surface 40c, that faces the first side surface 50c is preferably ½ or less of the area of the first side surface 40c of the first light emitting element 40.

A length of the first side surface 40c of the first light emitting element 40 is referred to as a length l1, and a length of the second side surface 50c of the second light emitting element 50 is referred to as a length l2. Distance d between the first side surface 40c of the first light emitting element 40 and the first side surface 50c of the second light emitting element 50 facing each other is preferably shorter than either of the length l1 or the length l2, as seen in a plan view, whichever is shorter. In the case where the length l1 of the first side surface 40c and the length l2 of the first side surface 50c are equal to each other, the distance d is preferably shorter than the length l1 of the first side surface 40c. The distance d is preferably such a size for the following reason. Even in the case where the first side surface 40c of the first light emitting element 40 and the first side surface 50c of the second light emitting element 50 face each other, if a gap therebetween is long, the degree of the accumulation of the heat and the degree of the concentration of the light are low. Therefore, the effect provided by locating the first side surface 40c and the first side surface 50c as described above is small.

As shown in FIG. 4A, a part of the first side surface 40c of the first light emitting element 40 and a part of the first side surface 50c of the second light emitting element 50 are located on the same straight line extending in a second direction (i.e., x axis direction) perpendicular to the first direction on the top surface 21a of the first lead 20. In FIG. 4A, a portion 40ca, represented by the thick line, of the first side surface 40c of the first light emitting element 40, and a portion 50ca, represented by the thick line, of the first side surface 50c of the second light emitting element 50, are located on the same straight line extending in the second direction (i.e., x axis direction). When the first light emitting element 40 and the second light emitting element 50 are repeatedly turned on and off, the first resin portion 31 located between the first lead 21 and the second lead 22 is subjected to a thermal stress in such a direction as to be extended toward, and contracted from, the first lead 21 and the second lead 22. In other words, in the light emitting device 100, the thermal stress is likely to be applied in the second direction perpendicular to the first direction, in which the first resin portion 31 is extended. With this arrangement, even in the case where a stress is caused in the element facing portion 70a due to the concentration of the heat and the light, a part of the stress along the second direction is propagated to, and is absorbed by, the first light emitting element 40 and the second light emitting element 50. Therefore, the stress caused in the element facing portion 70a is weakened as a whole, and thus the encapsulant 70 is less likely to be cracked.

As shown in FIG. 4B and FIG. 4C, the encapsulant 70 located in the recessed portion 11 of the resin package 10 includes a thin portion 70b, which is thinnest in a thickness direction (z axis direction). The thin portion 70b is located at, or in the vicinity of, the center of the encapsulant 70 as seen in a plan view, and is formed because the material of the encapsulant 70 is contracted during a production process thereof. As seen in a cross-sectional view, the thin portion 70b has a thickness of about 415 µm, whereas a thickest portion has a thickness of, for example, about 450 µm. As shown in FIG. 4A, the element facing portion 70a, where the first side surface 40c of the first light emitting element 40 and the first side surface 50c of the second light emitting element 50 face each other, is preferably shifted from the thin portion 70b as seen in a plan view. Namely, it is preferable that the thin portion 70b does not overlap the element facing portion 70a and is located outward of the facing portion 70a as seen in a plan view.

When a stress is caused in the encapsulant 70 due to the heat and the light of the first light emitting element 40 and the second light emitting element 50, the thin portion 70b, which is thin, is most likely to be cracked. In order to avoid or inhibit this, the thin portion 70b and the element facing portion 70a are shifted from each other, so that the encapsulant 70 is further less likely to be cracked.

Method for Producing Light Emitting Device 100

The light emitting device 100 may be produced by, for example, as follows. First, a lead frame provided with a plurality of the first leads 21 and a plurality of the second leads 22 is prepared. Subsequently, a plurality of the first resin portions 31 and a plurality of the second resin portions 32 are formed integrally with the first leads 21 and the second leads 22 by molding such as transfer molding or the like. As a result, the lead frame provided with a plurality of resin molded bodies including a plurality of recessed portions 11 is provided. The lead frame provided with the resin molded bodies may be, for example, purchased.

Subsequently, the first light emitting element 40, the second light emitting element 50 and the protective element 60 are mounted in each of the plurality of recessed portions 11 of the lead frame provided with the resin molded bodies. The first lead 21 and the second lead 22 are connected with the first light emitting element 40, the second light emitting element 50 and the protective element 60 by wires. Then, encapsulant 70 is supplied in the recessed portions 11 such that the encapsulant 70 covers the first light emitting element 40 and the second light emitting element 50. The lead frame provided with the resin molded bodies having the light emitting elements and the like mounted thereon is divided into individual light emitting devices 100 by a method such as dicing or the like. Thus, the light emitting device 100 is produced.

Advantageous Effects and Others

In the light emitting device 100, only a part of the first side surface 40c of the first light emitting element 40 and only a part of the first side surface 50c of the second light emitting element 50 face each other. This can realize a smaller area of the element facing portion 70a, which is held between the two first side surfaces 40c and 50c and in which heat and light are likely to be concentrated. Therefore, the encapsulant 70 is less likely to be degraded due to the heat and the light.

In the light emitting device 100 in the present disclosure, the first side surface 40c of the first light emitting element 40 and the first side surface 50c of the second light emitting element 50 are allowed to face each other partially. Comparing with the case where the first light emitting element 40 and the second light emitting element 50 are located such that diagonal lines of the light emitting elements 40 and 50 are completely on the same straight line and thus the first side surfaces thereof do not face each other, the width (length) of the light emitting elements 40 and 50 in the direction in which the light emitting elements 40 and 50 are located (first direction) can be shortened, while the encapsulant 70 is less likely to be degraded, resulted in, for example, being cracked. Such a structure of the light emitting device 100 is especially effective for incorporating two or more light emitting elements in a resin package having a small external size.

The area of a portion, of the first side surface 40c of the first light emitting element 40, that faces the first side surface 50c of the second light emitting element 50 is ½ or less of the area of the first side surface 40c of the first light emitting element 40. This improves the above-described effect. The relationship between the size of the resin package 10 and the size of the first light emitting element 40 and the second light emitting element 50 is, for example, as follows. While the resin package 10 has a size in a range of 2000 μm to 3500 μm×2000 μm to 3500 μm, the first light emitting element 40 and the second light emitting element 50 each have a size in a rage of 600 μm to 1500 μm×600 μm to 1500 μm. In the case of the above-described size relationship between the resin package 10 and the first light emitting element 40 and the second light emitting element 50, the distance d between the first side surface 40c of the first light emitting element 40 and the first side surface 50c of the second emitting element 50 is, for example, in a range of 50 μm to 500 μm.

A part of the first side surface 40c of the first light emitting element 40 and a part of the first side surface 50c of the second light emitting element 50 are located on the same straight line extending in the second direction perpendicular to the first direction on the top surface 21a of the first lead 21. With this structure, the stress in the second direction generated in the encapsulant 70 is absorbed by the first light emitting element 40 and the second light emitting element 50, and thus the stress, which would otherwise cause a crack in the encapsulant 70, is alleviated.

The first light emitting element 40 and the second light emitting element 50 are located such that the element facing portion 70a held between the first side surface 40c of the first light emitting element 40 and the first side surface 50c of the second light emitting element 50 is located in a region other than the thin portion 70b, which is most likely to be cracked among various parts of the encapsulant 70. With this structure, the encapsulant 70 is further less likely to be cracked.

For the above-described reasons, the present disclosure provides a light emitting device including a plurality of light emitting elements and having heat resistant.

Other Embodiments

The light emitting device 100 may be modified in any of various ways. For example, the structure of the light emitting elements 40 and 50 other than their arrangement, the structure and the form of the resin package 10, the structure of the encapsulant 70, and the like are appropriately selected other than described above. Forms other than those described in the above embodiment may be preferably usable for the light emitting device according to the present disclosure. The light emitting elements 40 and 50 may be located in another positional arrangement. Hereinafter, other forms of the positional arrangement of the first light emitting element 40 and the second light emitting element 50 will be described.

Figure 5:
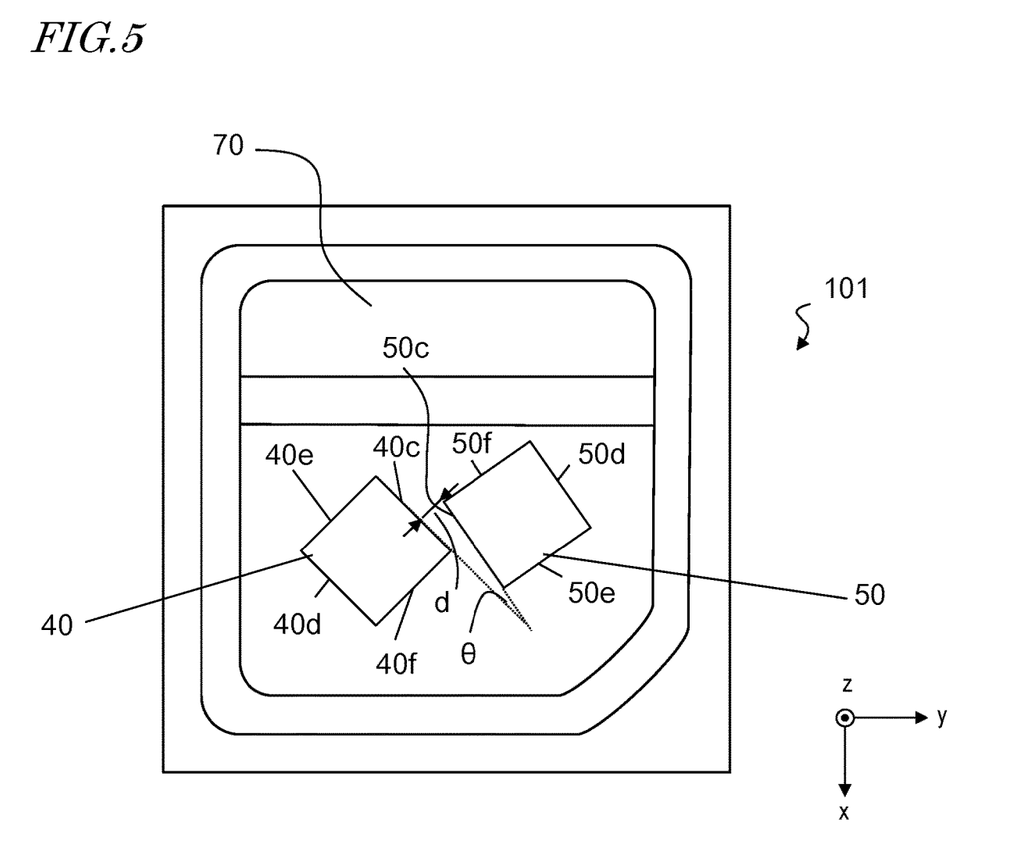
FIG. 5 is a schematic plan view of another light emitting device according to the present disclosure.

FIG. 5 is a schematic plan view showing an example of another positional arrangement of the first light emitting element 40 and the second light emitting element 50. In FIG. 5 and the figures thereafter, the wires are not shown.

In a light emitting device 101 shown in FIG. 5, the first side surface 40c of the first light emitting element 40 and the first side surface 50c of the second light emitting element 50 are not parallel to each other, but define an angle θ, as seen in a plan view. The angle θ is, for example, 45 degrees or less. In the case where the angle defined by the first side surface 40c of the first light emitting element 40 and the first side surface 50c of the second light emitting element 50 is not 0 degrees, there may exist two or more pairs of side faces which face with each other between the first light emitting element 40 and the second light emitting element 50. For example, in the light emitting device 101 shown in FIG. 5, the first side surface 50c of the second light emitting element 50 also faces the fourth side surface 40f of the first light emitting element 40. As can be seen, in the case where the angle θ is not 0 degrees, it is sufficient that among the side surfaces of the first light emitting element 40 and the second light emitting element 50, a pair of side surfaces making the smallest angle as seen in a plan view meet the condition described in the above embodiment regarding the positional arrangement. In this case, the distance d between the first side surface 40c of the first light emitting element 40 and the first side surface 50c of the second light emitting element 50 is a distance of a phantom line, at a position where the two side surfaces are farthest from each other, extending perpendicularly from one of the side surfaces to the other surface.

In the case where the first side surface 40c of the first light emitting element 40 and the first side surface 50c of the second light emitting element 50 are not parallel to each other, light emitted from one of the side surfaces is less likely to be repeatedly reflected between the two side surfaces. For example, a part of light radiating from a portion, of the first side surface 40c of the first light emitting element 40, that is in the element facing portion 70a is reflected by the first side surface 50c of the second light emitting element 50 and returns to the first side surface 40c of the first light emitting element 40. Then, the light may be reflected by the first side surface 40c and propagated in the encapsulant 70 without being incident on the first side surface 50c of the second light emitting element 50. As can be seen, in the case where the first side surface 40c of the first light emitting element 40 and the first side surface 50c of the second light emitting element 50 are not parallel to each other, it can inhibit light to be reflected in a multiple times between the first side surfaces 40c and 50c. This alleviates the concentration of the light in the element facing portion 70a.

Figure 6A:
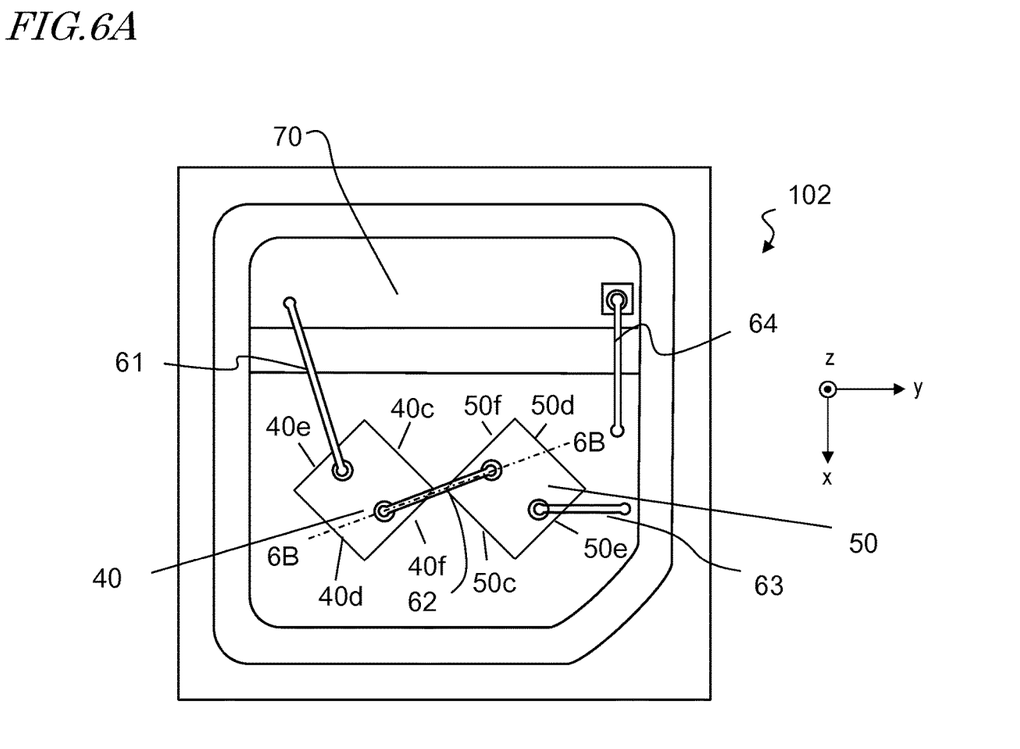
FIG. 6A is a schematic plan view of still another light emitting device according to the present disclosure.
Figure 6B:
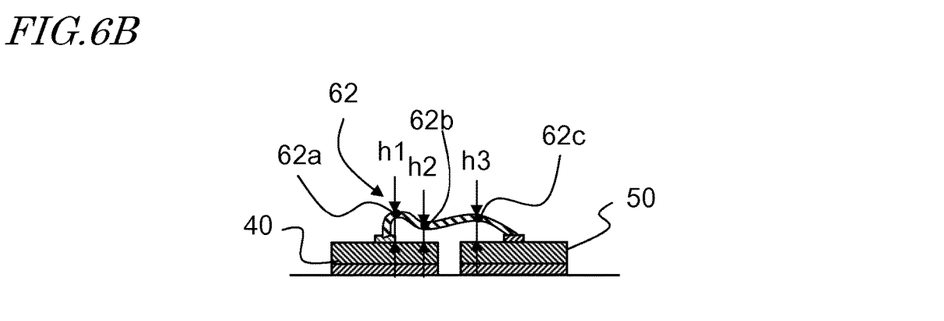
FIG. 6B is a schematic cross-sectional view of the still another light emitting device taken along line 6B-6B in FIG. 6A.

FIG. 6A is a schematic plan view showing still another example of positional arrangement of the first light emitting element 40 and the second light emitting element 50. FIG. 6B is a schematic cross-sectional view taken along line 6B-6B in FIG. 6A. In a light emitting device 102 shown in FIG. 6A, the first light emitting element 40 and the second light emitting element 50 each have a quadrangular shape as seen in a plan view. The first side surface 40c of the first light emitting element 40 and the first side surface 50c of the second light emitting element 50 do not face each other. A diagonal line of the quadrangular shape of the first light emitting element 40 and a diagonal line of the quadrangular shape of the second light emitting element 50 are on the same straight line, which is parallel to the first direction, as seen in a plan view. The concept represented by the expression that "the diagonal line of the quadrangular shape of the first light emitting element 40 and the diagonal line of the quadrangular shape of the second light emitting element 50 are on the same straight line as seen in a plan view" encompasses a state where the two diagonal lines are on completely the same line, and also a state where one of the two diagonal lines has an angle of about 0° to ±5° with respect to the other diagonal line. With this structure, there is no element facing portion, where one side surface of one of the two light emitting elements faces one side surface of the other light emitting element. Therefore, the encapsulant 70 is further less likely to be degraded by the heat and the light.

As shown in FIG. 6B, the wire 62 electrically connecting the first light emitting element 40 and the second light emitting element 50 to each other includes a first bending point 62a, a third bending point 62c, and a second bending point 62b located between the first bending point 62a and the third bending point 62c. The first through third bending point 62a, 62b and 62c are located between the electrode of the first light emitting element 40 and the electrode of the second light emitting element 50. The first through third bending point 62a, 62b and 62c are positioned in a height direction at heights h1, h2 and h3, respectively. The height h2 of the second bending point 62b is lower than the first bending point h1 and the third bending point h3 in a height direction.

With the wire 62 having the above-described shape, a wire portion in the vicinity of a second bonding point 62b is less likely to be hung and touch the top surface of the light emitting element, thereby inhibiting the light emitting device 102 from being electrically shortcircuited. In addition, in the light emitting device 102, the second bending point 62b of the wire 62 is located above the first light emitting element 40 or the second light emitting element 50. With this structure, the second bending point 62b, which is at a relatively low position among various parts of the wire 62 in the height direction, is distanced from a region where the first light emitting element 40 and the second light emitting element 50 are closest to each other and thus heat and light are likely to be concentrated. As a result, the encapsulant 70 is suppressed from being cracked from the wire 62. The shape of the wires shown in FIG. 6A and FIG. 6B is applicable to other embodiments.

Figure 7:
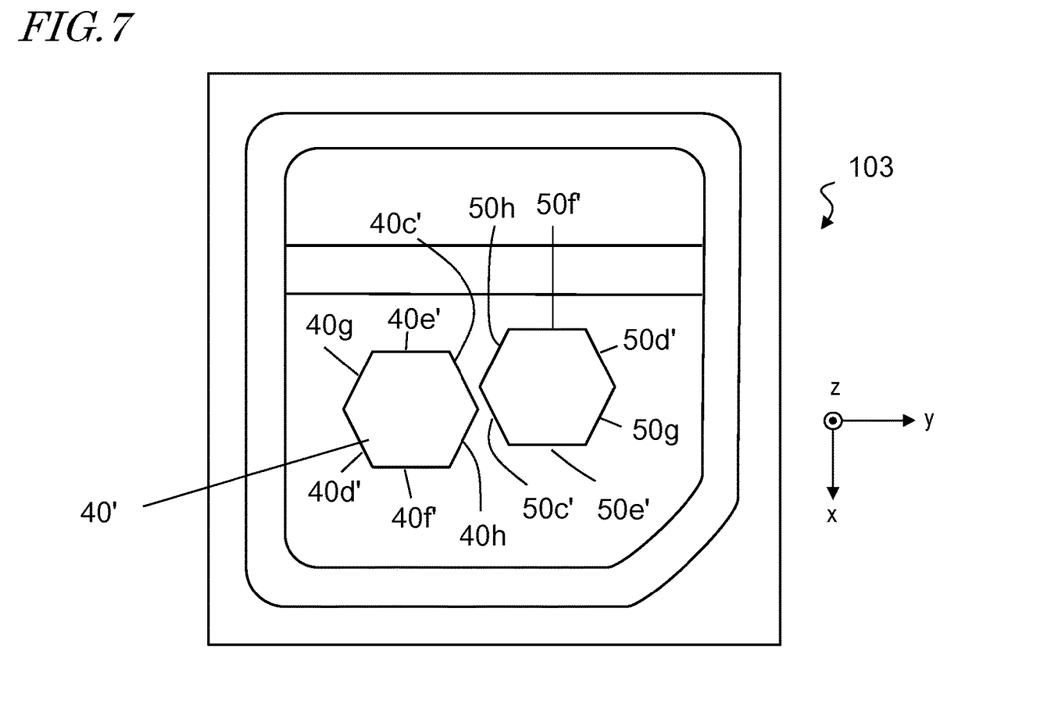
FIG. 7 is a schematic plan view of still another light emitting device according to the present disclosure.

FIG. 7 is a schematic plan view showing still another embodiment of positional arrangement of the first light emitting element 40 and the second light emitting element 50. In a light emitting device 103 shown in FIG. 7, a first light emitting element 40' and a second light emitting element 50' are approximately hexagonal as seen in a plan view. A first side surface 40c' of the first light emitting element 40' and a first side surface 50c' of the second light emitting element 50' face each other partially. In the light emitting device 103, the first side surface 40c' of the first light emitting element 40' and a sixth side surface 50h of the second light emitting element 50' may be considered to face each other, and a sixth side surface 40h of the first light emitting element 40' and the first side surface 50c' of the second light emitting element 50' may be considered to face each other. However, the first side surface 40c' and the first side surface 50c' defined the smallest angle among the angles defined by two side surfaces facing each other as seen in a plan view. Therefore, the first side surface 40c' and the first side surface 50c' meet the condition regarding the positional arrangement described in the above embodiment.

Even in the case where the light emitting elements have a shape other than a quadrangular shape as seen in a plan view, as long as the side surfaces of the two light emitting elements meet the above-described condition, the heat and the light emitted from the light emitting elements are less likely to be concentrated in a part of the encapsulant, and thus the above-described effect is provided.

Figure 8:
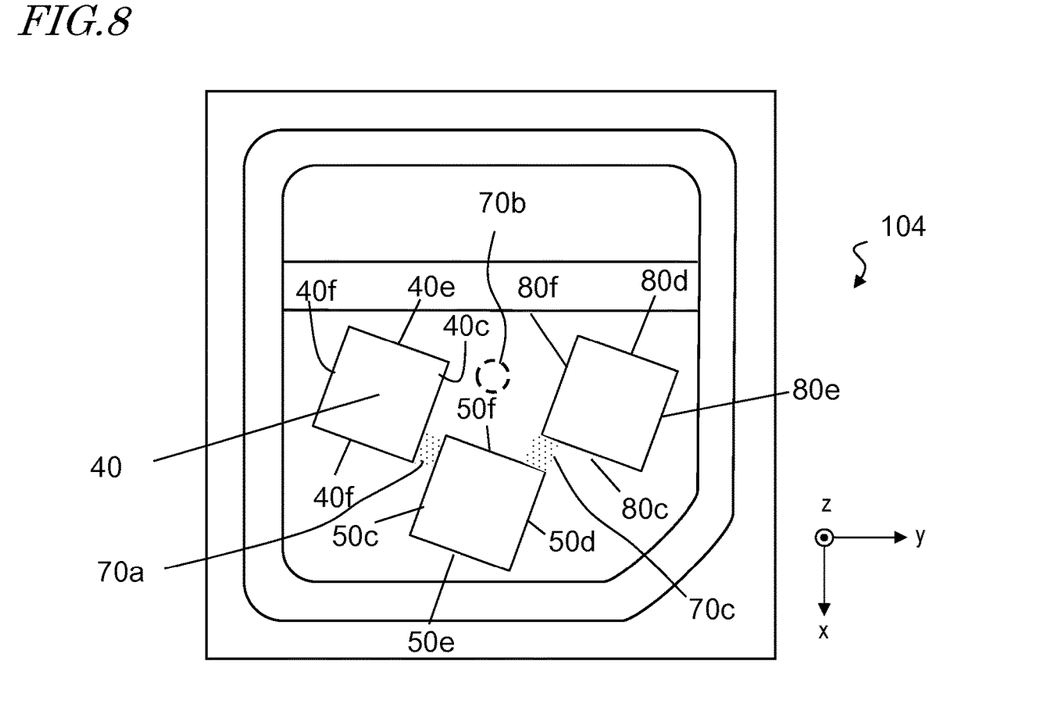
FIG. 8 is a schematic plan view of still another light emitting device according to the present disclosure.

FIG. 8 is a schematic plan view showing an example of positional arrangement in the case where a light emitting device includes three light emitting elements. A light emitting device 104 shown in FIG. 8 includes the first light emitting element 40, the second light emitting element 50 and a third light emitting element 80. In the light emitting device 104, the first side surface 40c of the first light emitting element 40 and the first side surface 50c of the second light emitting element 50 face each other partially. The fourth side surface 50f of the second light emitting element 50 and a first side surface 80c of the third light emitting element 80 face each other partially.

A part of the first side surface 40c of the first light emitting element 40 and a part of the first side surface 50c of the second light emitting element 50 are located on the same straight line extending in the second direction (i.e., x axis direction) perpendicular to the first direction on the top surface 21a of the first lead 21. A part of the fourth side surface 50f of the second light emitting element 50 and a part of the first side surface 80c of the third light emitting element 80 are located on the same straight line extending in the second direction.

The element facing portion 70a, where the first side surface 40c of the first light emitting element 40 and the first side surface 50c of the second light emitting element 50 face each other, is shifted from the thin portion 70b as seen in a plan view. An element facing portion 70c, where the fourth side surface 50f of the second light emitting element 50 and the first side surface 80c of the third light emitting element 80 face each other, is also shifted from the thin portion 70b as seen in a plan view.

The light emitting device 104 having such a structure can provide substantially the same effect as that of the light emitting device 100 in the above embodiment.

A light emitting device according to the present disclosure is applicable as a light source for various uses, and is especially preferably usable for a light emitting device requiring high luminance, for example, a backlight unit, a lighting device, an interior or exterior lighting for vehicles, or the like.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:
1. A light emitting device comprising:
   a resin package comprising:
      a first lead and a second lead, each including a top surface and a bottom surface, and
      a first resin portion located between the first lead and the second lead and extending in a first direction;
   a first light emitting element and a second light emitting element arrayed on the top surface of the first lead in the first direction, the first light emitting element and the second light emitting element each including at least a first side surface;
   a first wire electrically connecting the first light emitting element and the second light emitting element to each other; and
   an encapsulant located on the top surface of the first lead and covering the first light emitting element and the second light emitting element, wherein a portion of a top surface of the encapsulant is depressed, and a lowest portion of the top surface of the encapsulant is located at a center of the light emitting device or in a vicinity thereof, in a plan view;

wherein the first side surface of the first light emitting element and the first side surface of the second light emitting element partially face each other;

wherein a part of the first side surface of the first light emitting element and a part of the first side surface of the second light emitting element are located on the same imaginary straight line extending in a second direction perpendicular to the first direction on the top surface of the first lead; and wherein, in the plan view, a region at which a portion of the first side surface of the first light emitting element faces a portion of the first side surface of the second light emitting element is offset from the lowest portion of the top surface of the encapsulant, and a portion of the first wire is located in said region.

2. The light emitting device according to claim 1, wherein an area of a portion of the first side surface of the first light emitting element that faces a portion of the first side surface of the second light emitting element is ½ or less of an area of the first side surface of the first light emitting element.

3. The light emitting device according to claim 2, further comprising:

a second wire electrically connecting the second light emitting element and the second lead to each other; and a third wire electrically connecting the first light emitting element and the first lead to each other;

wherein, in the plan view, an imaginary straight line extending in the first direction and passing through the second wire also passes through said region; and wherein, in the plan view, an imaginary straight line extending in the first direction and passing through the third wire also passes through said region.

4. The light emitting device according to claim 2, wherein:

the resin package further includes a second resin portion that includes side surfaces that define a recessed portion;

a part of the top surface of the first lead, a part of the top surface of the second lead, and a top surface of the first resin portion are exposed at a bottom of the recessed portion;

the first light emitting element and the second light emitting element are located in the recessed portion;

the encapsulant is located in the recessed portion;

the recessed portion has an opening having an approximately quadrangular shape and having a chamfered portion at one corner of the an approximately quadrangular shape in the plan view;

in the plan view, an imaginary straight line extending in the second direction and passing through the chamfered portion also passes through the second light emitting element;

in the plan view, a shortest distance between the second light emitting element and the first resin portion in the second direction is smaller than a shortest distance between the first light emitting element and the first resin portion in the second direction.

5. The light emitting device according to claim 1, wherein each of the first light emitting element and the second light emitting element has an approximately quadrangular shape in the plan view, and each side of the quadrangular shape of each light emitting element is inclined with respect to the first direction and the second direction.

6. The light emitting device according to claim 1, wherein:

the resin package further includes a second resin portion that includes side surfaces that define a recessed portion;

a part of the top surface of the first lead, a part of the top surface of the second lead, and a top surface of the first resin portion are exposed at a bottom of the recessed portion;

the first light emitting element and the second light emitting element are located in the recessed portion; and the encapsulant is located in the recessed portion.

7. The light emitting device according to claim 6, wherein:

the recessed portion has an opening having an approximately quadrangular shape and having a chamfered portion at one corner of the an approximately quadrangular shape, in the plan view; and in the plan view, an imaginary straight line extending in the second direction and passing through the chamfered portion also passes through the second light emitting element.

8. The light emitting device according to claim 7, wherein, in the plan view, a shortest distance between the second light emitting element and the first resin portion in the second direction is smaller than a shortest distance between the first light emitting element and the first resin portion in the second direction.

9. The light emitting device according to claim 1, further comprising:

a second wire electrically connecting the second light emitting element and the second lead to each other; and in the plan view, an imaginary straight line extending in the first direction and passing through the second wire also passes through said region.

10. The light emitting device according to claim 9, further comprising:

a third wire electrically connecting the first light emitting element and the first lead to each other; and in the plan view, an imaginary straight line extending in the first direction and passing through the third wire also passes through said region.

11. The light emitting device according to claim 1, further comprising:

an additional wire electrically connecting the first light emitting element and the first lead to each other; and in the plan view, an imaginary straight line extending in the first direction and passing through the additional wire also passes through said region.

12. The light emitting device according to claim 1, further comprising:

a protective element; and an additional wire electrically connecting the protective element and the first lead to each other;

wherein, in the plan view, an imaginary straight line extending in the first direction and passing through the additional wire also passes through the second light emitting element.

13. A light emitting device, comprising:

a resin package comprising:

a first lead and a second lead, each including a top surface and a bottom surface, and a first resin portion located between the first lead and the second lead and extending in a first direction;

a first light emitting element and a second light emitting element arrayed on the top surface of the first lead in the first direction;

a first wire electrically connecting the first light emitting element and the second light emitting element to each other; and an encapsulant located on the top surface of the first lead and covering the first light emitting element and the second light emitting element;

wherein each of the first light emitting element and the second light emitting element has a quadrangular shape in a plan view;

wherein, in the plan view, a diagonal line of the quadrangular shape of the first light emitting element and a diagonal line of the quadrangular shape of the second light emitting element are on the same imaginary straight line, and the first wire crosses said same imaginary straight line;

wherein the first wire includes a first bending point, a second bending point, and a third bending point, the second bending point being located between the first bending point and the third bending point, and the first, second, and third bending points being located between an electrode of the first light emitting element and an electrode of the second light emitting element in the plan view; and wherein the second bending point is lower than the first bending point and the third bending point in a height direction.

14. The light emitting device according to claim 13, wherein the second bending point is located above the first light emitting element or the second light emitting element in the plan view.

15. The light emitting device according to claim 13, wherein:

a portion of a top surface of the encapsulant is depressed, and a lowest portion of the top surface of the encapsulant is located at a center of the light emitting device or in a vicinity thereof, in the plan view; and in the plan view, the lowest portion of the top surface of the encapsulant is apart from the first wire.

16. The light emitting device according to claim 13, wherein each side of the quadrangular shape of each light emitting element is inclined with respect to the first direction and a second direction perpendicular to the first direction.

17. The light emitting device according to claim 13, further comprising:

a protective element; and an additional wire electrically connecting the protective element and the first lead to each other;

wherein, in the plan view, an imaginary straight line extending in the first direction and passing through the additional wire also passes through the second light emitting element.

18. The light emitting device according to claim 13, wherein:

the resin package further includes a second resin portion that includes side surfaces that define a recessed portion;

a part of the top surface of the first lead, a part of the top surface of the second lead, and a top surface of the first resin portion are exposed at a bottom of the recessed portion;

the first light emitting element and the second light emitting element are located in the recessed portion;

the encapsulant is located in the recessed portion;

the recessed portion has an opening having an approximately quadrangular shape and having a chamfered portion at one corner of the an approximately quadrangular shape in the plan view; and in the plan view, an imaginary straight line extending in the second direction and passing through the chamfered portion also passes through the second light emitting element.

19. The light emitting device according to claim 18, wherein the second bending point is located above the first light emitting element or the second light emitting element in the plan view.

* * * * *